United States Patent
Jia et al.

(10) Patent No.: US 10,444,630 B2
(45) Date of Patent: Oct. 15, 2019

(54) SEPARATING DEVICE FOR BONDED CINE FILM AND METHOD THEREFOR

(71) Applicant: Shaanxi Normal University, Xi'an (CN)

(72) Inventors: Zhihui Jia, Xi'an (CN); Yuhu Li, Xi'an (CN); Xiaolian Chao, Xi'an (CN)

(73) Assignee: Shaanxi Normal University, Xi'an (CN)

( * ) Notice: Subject to any disclaimer, the term of this patent is extended or adjusted under 35 U.S.C. 154(b) by 0 days.

(21) Appl. No.: 16/257,851

(22) Filed: Jan. 25, 2019

(65) Prior Publication Data
US 2019/0235388 A1    Aug. 1, 2019

(30) Foreign Application Priority Data

Jan. 26, 2018   (CN) .......................... 2018 1 0078931

(51) Int. Cl.
*B32B 43/00* (2006.01)
*F17C 7/04* (2006.01)
(Continued)

(52) U.S. Cl.
CPC ............ *G03F 7/343* (2013.01); *B32B 43/006* (2013.01); *F17C 7/04* (2013.01);
(Continued)

(58) Field of Classification Search
CPC ......... Y10T 156/1111; Y10T 156/1126; Y10T 156/1153; Y10T 156/1911;
(Continued)

(56) References Cited

U.S. PATENT DOCUMENTS 2,843,925 A * 7/1958 Logue ..................... H01J 9/50
156/710
3,297,406 A * 1/1967 Diefendorf .......... C04B 35/522
156/711
(Continued)

FOREIGN PATENT DOCUMENTS

CN           1697677      11/2005
CN         102243434      11/2011
(Continued)

OTHER PUBLICATIONS

Film-Tech Forums, Topic: Has anyone tried this: Vinegar Syndrome Cure, Film-Tech Cinema Systems, LLC. http://www.film-tech.com/ubb/f1/t003827.html (Year: 2018).*
(Continued)

*Primary Examiner* — Mark A Osele
(74) *Attorney, Agent, or Firm* — Hanley, Flight & Zimmerman, LLC

(57) ABSTRACT

A separating device and method for a bonded cine film, belonging to the field of image file protection and repair technologies. The separating device comprises a pressurizing device, a separating device and a liquid nitrogen storage device. The pressurizing device is connected to the liquid nitrogen storage device; the liquid nitrogen storage device is connected to the separating device for providing liquid nitrogen thereto; the separating device comprises a film receiving chamber for accommodating a film to be separated; the pressurizing device pressurizes the liquid nitrogen storage device allowing liquid nitrogen to enter the film receiving chamber. Due to a difference between expansion coefficients of a base layer and emulsion layer of the film under low temperature, micro-pores and gaps may be generated in the base layer and the emulsion layer of a bonded
(Continued)

film roll; the liquid nitrogen penetrates into the micro-pores and gaps of the bonded film.

10 Claims, 7 Drawing Sheets

(51) Int. Cl.
*G03F 7/26* (2006.01)
*G03F 7/34* (2006.01)

(52) U.S. Cl.
CPC .. *B32B 2310/0427* (2013.01); *Y10T 156/1111* (2015.01); *Y10T 156/1126* (2015.01); *Y10T 156/1153* (2015.01); *Y10T 156/1911* (2015.01); *Y10T 156/1928* (2015.01)

(58) Field of Classification Search
CPC ...... Y10T 156/1928; G03F 7/343; F17C 7/04; B32B 43/006; B32B 2310/0427
See application file for complete search history.

(56) References Cited

U.S. PATENT DOCUMENTS

| | | | | |
|---|---|---|---|---|
| 4,487,643 A * | 12/1984 | Ellett | .................... | B08B 7/0092 156/155 |
| 4,956,042 A * | 9/1990 | Hubert | .................. | B08B 7/0092 118/315 |
| 5,091,034 A * | 2/1992 | Hubert | .................. | B08B 7/0092 134/17 |
| 6,357,238 B1 * | 3/2002 | Brothers | .................... | F17C 7/02 62/48.1 |
| 6,383,329 B1 * | 5/2002 | Agarwala | ............. | B08B 7/0092 134/7 |
| 6,537,737 B1 * | 3/2003 | Wagner | .................... | G03C 5/28 430/359 |
| 6,969,581 B1 * | 11/2005 | Wagner | .................. | G03C 11/06 430/359 |
| 7,144,461 B2 * | 12/2006 | Sawaguchi | ........ | B01D 11/0203 134/3 |
| 9,062,904 B2 * | 6/2015 | Doty | .......................... | F17C 7/04 |
| 9,545,783 B2 * | 1/2017 | Gillard | .................... | B29B 17/02 |
| 9,841,666 B2 * | 12/2017 | Li | ........................... | G03C 11/04 |
| 2006/0054185 A1 | 3/2006 | Sawaguchi et al. | | |
| 2012/0313273 A1 | 12/2012 | Li et al. | | |
| 2016/0003524 A1 * | 1/2016 | Blalock | ..................... | F17C 5/04 62/48.2 |
| 2016/0084441 A1 * | 3/2016 | Fauvel | ...................... | F17C 5/02 62/50.2 |
| 2016/0377971 A1 | 12/2016 | Li et al. | | |
| 2017/0284602 A1 * | 10/2017 | Song | ........................ | F17C 7/04 |
| 2018/0016130 A1 * | 1/2018 | Watts | ........................ | F17C 9/00 |
| 2018/0319149 A1 * | 11/2018 | Park | ...................... | B32B 43/006 |

FOREIGN PATENT DOCUMENTS

| | | |
|---|---|---|
| CN | 104946023 | 9/2015 |
| CN | 106773519 | 5/2017 |

OTHER PUBLICATIONS

Machine Translation of CN106773519A. (Year: 2019).*
China National Intellectual Property Administration, First Office Action issued in connection with Chinese Application No. 201810078931.1 with English translation, dated May 13, 2019, 6 pages.
China National Intellectual Property Administration, Search Report issued in connection with Chinese Application No. 201810078931.1, with English translation, dated May 13, 2019, 2 pages.

* cited by examiner

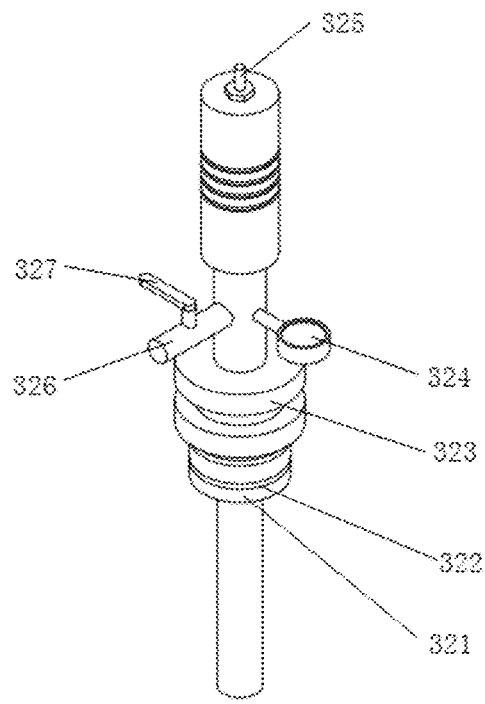
Fig. 9
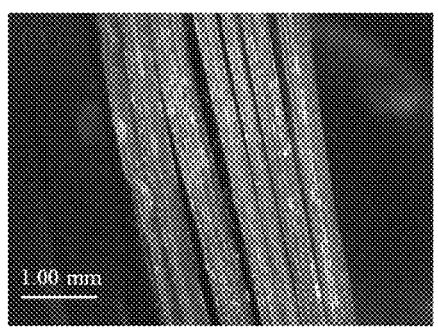 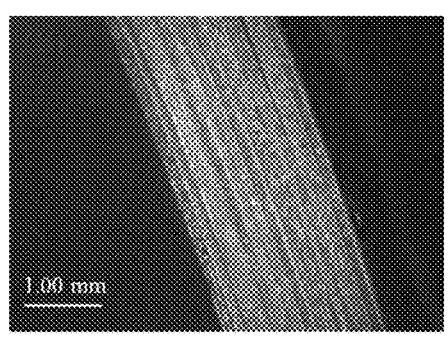
Fig. 10a          Fig. 10b

Fig. 10c                                Fig. 10d

SEPARATING DEVICE FOR BONDED CINE FILM AND METHOD THEREFOR

TECHNICAL FIELD

The present invention relates to the field of image file protection and repair technologies, in particular to a separating device for a bonded cine film and a method therefor.

BACKGROUND ART

The current situation of acidification hardening of the cellulose acetate cine film occurs in accompany with the "acetate acid syndrome" and it is a worldwide problem. At least one-third of the cellulose acetate films collected in the world are acidified and bonded due to the acetic acid syndrome, and the rest faces the similar fate. After the acidification hardening, the macroscopic performance of the whole film roll is mainly characterized in that the smell is of pungent acetic acid, white crystals are precipitated on the film surface, the film is distorted, the mechanical strength is decreased, the bonding force between the image layer and the base layer is reduced such that they will easily fall off, the emulsion layer is liquefied, the whole film roll is bonded into a block, and finally the image information disappears completely. How to separate the acidified and hardened cellulose acetate cine film has become a common social problem, and it is also a major scientific problem unsolved in the archive industry.

The bonding between the cine films greatly hinders the repair of the film roll. If a cine film is directly artificially separated during the repair, it will inevitably cause the already fragile film roll to break, or cause the emulsion layer with reduced bonding force to fall off. Till now, there is no report on a method for non-destructively separating the bonded film roll. Therefore, how to non-destructively separate the bonded cine film without damaging its body becomes a problem urgently to be solved in the repair and protection of the cine film at present.

SUMMARY OF THE INVENTION

In view of the problem existing in the prior art, the present invention proposes a separating device for a bonded cine film and a method therefor, which can separate the bonded cine film without damaging the pH, dimensional stability or mechanical properties of the film roll, thus achieving the purpose of non-destructive separation.

The present invention is achieved by the following technical solutions:

A separating device for a bonded cine film, comprising a pressurizing device, a separating device and a liquid nitrogen storage device;

the liquid nitrogen storage device comprises a liquid nitrogen storage tank and a sealing device; the sealing device is mounted at an outlet of the liquid nitrogen storage tank, and the liquid nitrogen storage tank is connected to the separating device through the sealing device, for providing liquid nitrogen to the separating device;

the pressurizing device is connected to the liquid nitrogen storage tank through the sealing device, for providing a pressure to the liquid nitrogen storage device;

the separating device is provided therein with a film receiving chamber for accommodating a film to be separated; the pressurizing device pressurizes the liquid nitrogen storage device to allow the liquid nitrogen to enter the film receiving chamber; the film receiving chamber is a sealed chamber and provided with a gas release valve that can be opened to start a gasification of the liquid nitrogen in the film receiving chamber, so as to separate the bonded cine film.

Optionally, the separating device comprises a separating box body and a separating box cover which are in sealed connection;

a film receiving chamber is provided in the separating box body, a film fixing shaft is provided in the film receiving chamber, and a thermal insulation layer is provided in a sidewall and a bottom of the separating box body, respectively; the separating box cover is provided with a first pressure gauge and a safety valve; the gas release valve comprises a coarse-adjustment gas release valve and a fine-adjustment gas release valve which are mounted on the separating box cover.

Optionally, a liquid nitrogen inlet is provided on a sidewall of the separating box body, and a liquid inlet valve is provided on the liquid nitrogen inlet.

Optionally, a first observation window is provided on a sidewall of the separating box body, and a second observation window is provided on the separating box cover.

Optionally, the sealing box body is provided with a sealing ring at a position contacting the separating cover body, and the separating box body and the separating cover body are connected to each other through a fastener.

Optionally, the sealing device comprises a sealing body, an adjusting knob and a sealing ring; the adjusting knob and the sealing body are in screwed connection, the sealing ring is mounted between an adjustment device and the sealing body, and the adjusting knob is rotated to extrude the sealing ring to radially expand, thereby achieving sealing.

Optionally, the sealing body is provided with a gas inlet passage connected to the pressurizing device, and a liquid outlet passage connected to the separating device, while a liquid valve is provided between the liquid outlet passage and the separating device.

Optionally, the pressurizing device comprises a pressurizing pump, a pressurizing pump box and a stop valve; the pressurizing pump is mounted in the pressurizing pump box, and the stop valve has one end connected to the pressurizing pump, and the other end connected to the liquid nitrogen storage device.

A separating method based on a separating device for a bonded cine film provided by the present invention, comprising:

accommodating a cine film to be separated into a film receiving chamber, and pressurizing a liquid nitrogen storage device by a pressurizing device; and injecting liquid nitrogen of the liquid nitrogen storage device into the film receiving chamber, and gasifying the liquid nitrogen at a rate of 2.0 L/h to 3.0 L/h to separate the cine film.

Optionally, the liquid nitrogen is gasified at a rate of 2.0 L/h to 3.0 L/h within a gasification time of 0.5 h to 3 h.

As compared with the prior art, the present invention has the following beneficial technical effects:

The present invention discloses a separating device for a bonded cine film, comprising a pressurizing device, a separating device and a liquid nitrogen storage device; the pressurizing device is connected to the liquid nitrogen storage device for providing a pressure thereto; the liquid nitrogen storage device is connected to the separating device for providing liquid nitrogen thereto; the separating device is provided therein with a film receiving chamber for accommodating a film to be separated; the pressurizing device pressurizes the liquid nitrogen storage device to allow the liquid nitrogen to enter the film receiving chamber. A film roll bonded into a block is wholly placed into the film receiving chamber where the liquid nitrogen is contained. During the gasification of the liquid nitrogen, due to a difference between expansion coefficients of a base layer and an emulsion layer of the film roll under a low temperature, micro-pores and gaps may be generated in the base layer and the emulsion layer of the bonded film roll; the gases may flow through the gaps between the layers of the bonded film roll. The film roll is separated after the liquid nitrogen in the airtight device is completely gasified and the temperature therein is raised to the room temperature. The entire separation process does not damage the pH, dimensional stability or mechanical properties of the film roll, and a non-destructive separation can be achieved.

Further, by providing a thermal insulation layer in a sidewall and a bottom of the separating box body, respectively, it ensures that a gasification rate is controllable when the liquid nitrogen is gasified.

Further, by providing the separating box body with a sealing ring at a position contacting the separating cover body, it ensures a sealed connection between the separating box body and the separating cover body.

The present invention discloses a separating method for a bonded cine film, comprising: accommodating a cine film to be separated into a film receiving chamber, and pressurizing a liquid nitrogen storage device by a pressurizing device; and injecting liquid nitrogen of the liquid nitrogen storage device into the film receiving chamber, and gasifying the liquid nitrogen at a rate of 2.0 L/h to 3.0 L/h to separate the cine film. The entire separation process does not damage the pH, dimensional stability or mechanical properties of the film roll, and a non-destructive separation can be achieved.

BRIEF DESCRIPTION OF THE DRAWINGS

FIG. 9 is a structural schematic view of a sealing device provided by an embodiment of the present invention;

FIG. 10a is a CCD diagram of a bonded film peeling process obtained through a first set of experiments provided by an embodiment of the present invention;

FIG. 10b is a CCD diagram of a bonded film peeling process obtained through a second set of experiments provided by an embodiment of the present invention;

FIG. 10c is a CCD diagram of a bonded film peeling process obtained through a third set of experiments provided by an embodiment of the present invention;

FIG. 10d is a CCD diagram of a bonded film peeling process obtained through a fourth set of experiments provided by an embodiment of the present invention;

In which,

1: pressurizing device; 2: separating device; 3: liquid nitrogen storage device;

11: pressurizing pump; 12: pressurizing pump box; 13: stop valve; 201: separating box body; 202: separating box cover; 203: safety valve; 204: first pressure gauge; 205: coarse-adjustment gas release valve; 206: fine-adjustment gas release valve; 207: liquid nitrogen inlet; 208: first observation window; 209: fastener; 210: second observation window; 211: liquid inlet valve; 212: thermal insulation layer; 213: film fixing shaft; 31: liquid nitrogen storage tank; 32: sealing device; 321: sealing body; 322: sealing ring; 323: adjusting knob; 324: second pressure gauge; 325: gas inlet passage; 326: liquid outlet passage; 327: liquid valve.

DETAILED DESCRIPTION OF THE PREFERRED EMBODIMENTS

The present invention will be further described in detail as follows with reference to the specific embodiments, which are explanations of, rather than limitations to the present invention.

Figure 1:
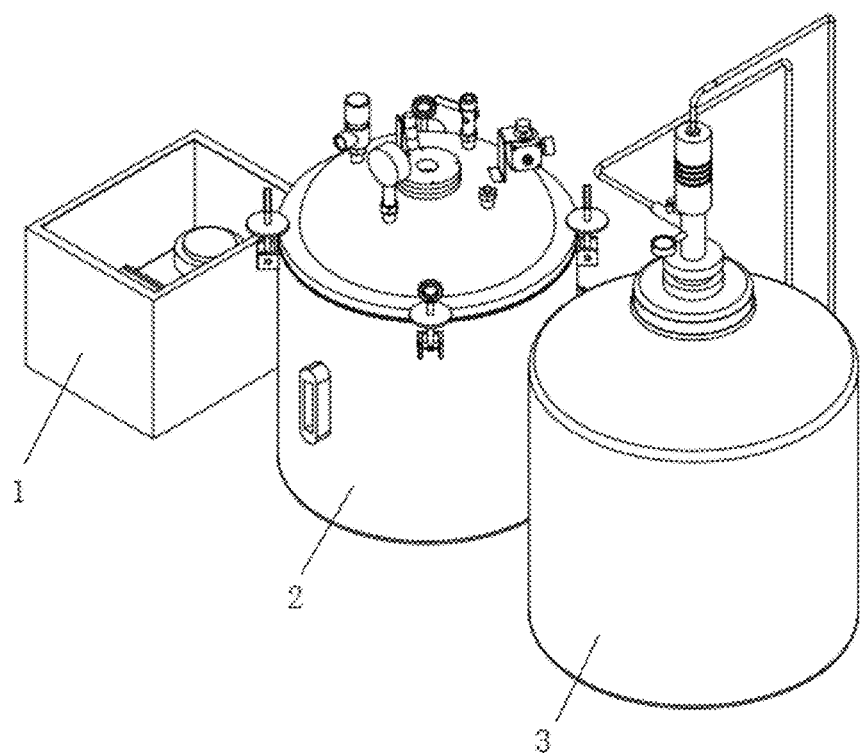
FIG. 1 is a perspective structural schematic view of a separating device for a bonded cine film provided by an embodiment of the present invention.
Figure 2:
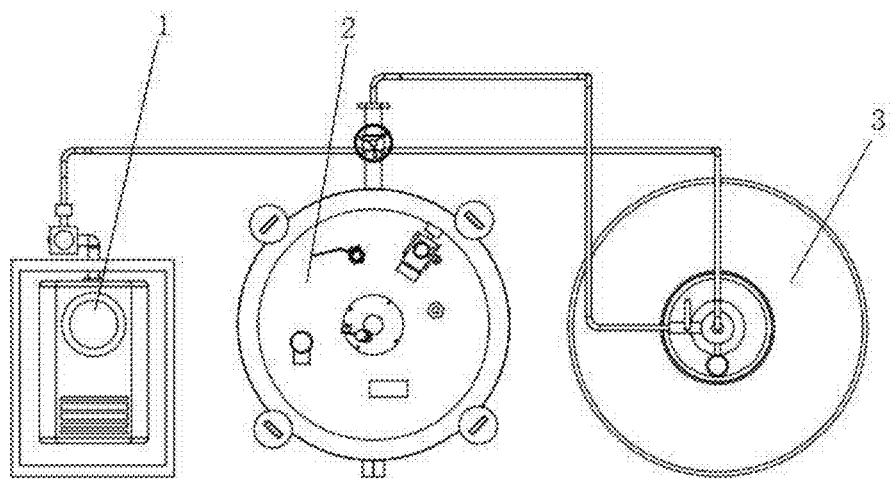
FIG. 2 is a top view of a separating device for a bonded cine film provided by an embodiment of the present invention.

As shown in FIGS. 1 and 2, a separating device for a bonded cine film, comprising a pressurizing device 1, a separating device 2 and a liquid nitrogen storage device 3; the pressurizing device 1 is connected to the liquid nitrogen storage device 3 for providing a pressure thereto; the liquid nitrogen storage device 3 is connected to the separating device 2 for providing liquid nitrogen thereto; the separating device 2 is provided therein with a film receiving chamber for accommodating a film to be separated; and the pressurizing device 1 pressurizes the liquid nitrogen storage device 3 to allow the liquid nitrogen to enter the film receiving chamber.

Figure 3:
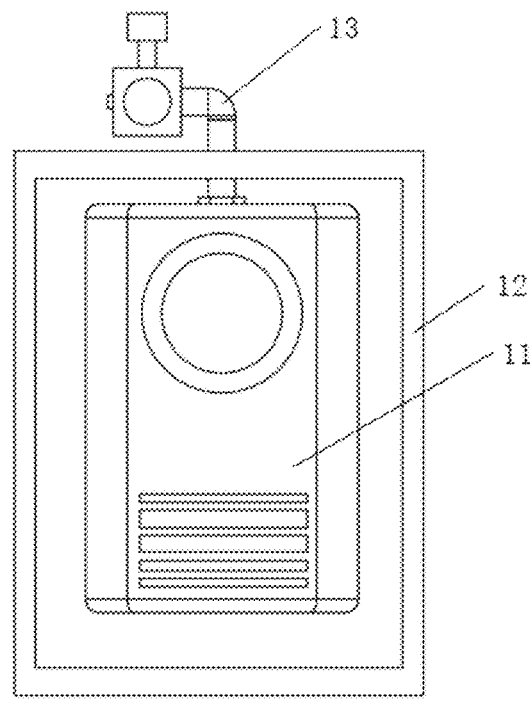
FIG. 3 is a structural schematic view of a pressurizing device provided by an embodiment of the present invention.

As shown in FIG. 3, the pressurizing device 1 comprises a pressurizing pump 11, a pressurizing pump box 12 and a stop valve 13; the pressurizing pump 11 is mounted in the pressurizing pump box 12; the stop valve 13 has one end connected to the pressurizing pump 11, and the other end connected to the liquid nitrogen storage device 3. In use, the stop valve 13 is opened, and the liquid nitrogen storage device 3 is pressurized by the pressurizing pump 11 to press the liquid nitrogen into the separating device 2. The pressurizing pump box 12 has a stainless-steel box body in which the pressurizing pump 11 is provided, thereby preventing the influence of dusts in the air on the pump, while making the overall appearance of the device be beautiful and generous.

Figure 4:
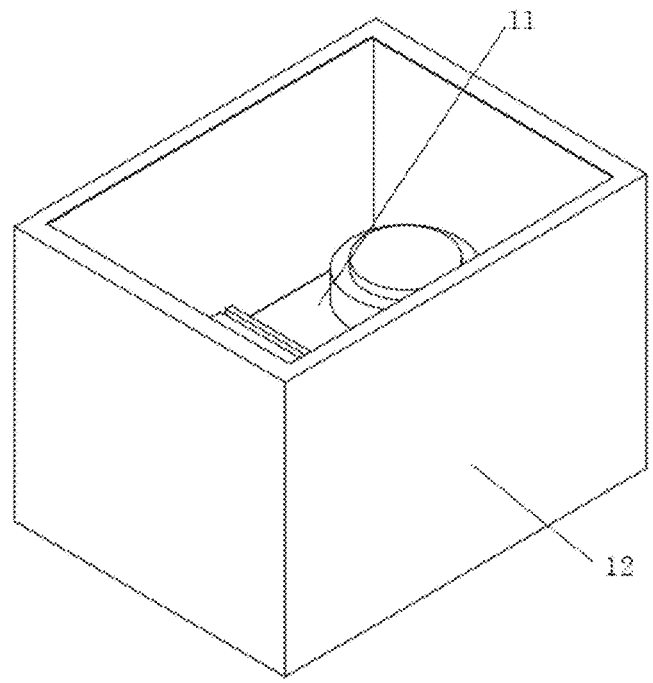
FIG. 4 is a perspective view of a pressurizing device provided by an embodiment of the present invention.

As shown in FIG. 4, the separating device 2 comprises a separating box body 201 and a separating box cover 202 which are in sealed connection; a film receiving chamber is provided in the separating box body 201, a film fixing shaft 213 is provided in the film receiving chamber, and a thermal insulation layer 212 is provided in a sidewall and a bottom of the separating box body 201, respectively, to prevent the liquid nitrogen from being gasified too fast; the separating box cover 202 is provided with a first pressure gauge 204, a coarse-adjustment gas release valve 205, a fine-adjustment gas release valve 206 and a safety valve 203. The separating box cover 202 is a single-layer stainless-steel body to prevent the liquid nitrogen from being not gasified, and it is hemispherical. The pressure gauge is used to detect a pressure change in the box body, the coarse-adjustment gas release valve 205 is used to coarsely adjust a nitrogen release rate, and the fine-adjustment gas release valve 206 is used to finely adjust the nitrogen release rate. The wall of the entire separation box body is a double-layered stainless-steel body with a thermal insulation layer provided therein.

A liquid nitrogen inlet 207 is provided on a sidewall of the separating box body 201, and a liquid inlet valve 211 is provided on the liquid nitrogen inlet 207. A first observation window 208 is provided on the sidewall of the separating box body 201, and a second observation window 210 is provided on the separating box cover 202. The first observation window 208 and the second observation window 210 are used to observe the internal gasification process and the amount of the liquid nitrogen added. The second observation window 210 is provided with illumination means.

The sealing box body 201 is provided with a sealing ring 322 at a position contacting the separating cover body; the separating box body 201 and the separating cover body are connected to each other through a fastener 209 having one end hinged with the separating box body 201; and the fastener 209 is provided with a thread connected to a chuck which can be turned to compress the separating box cover 202.

For example, since the film roll to be repaired is generally about 300 m in length and 35 mm in width, the film receiving chamber has an inner diameter of 300 mm and a height of 220 mm.

Figure 5:
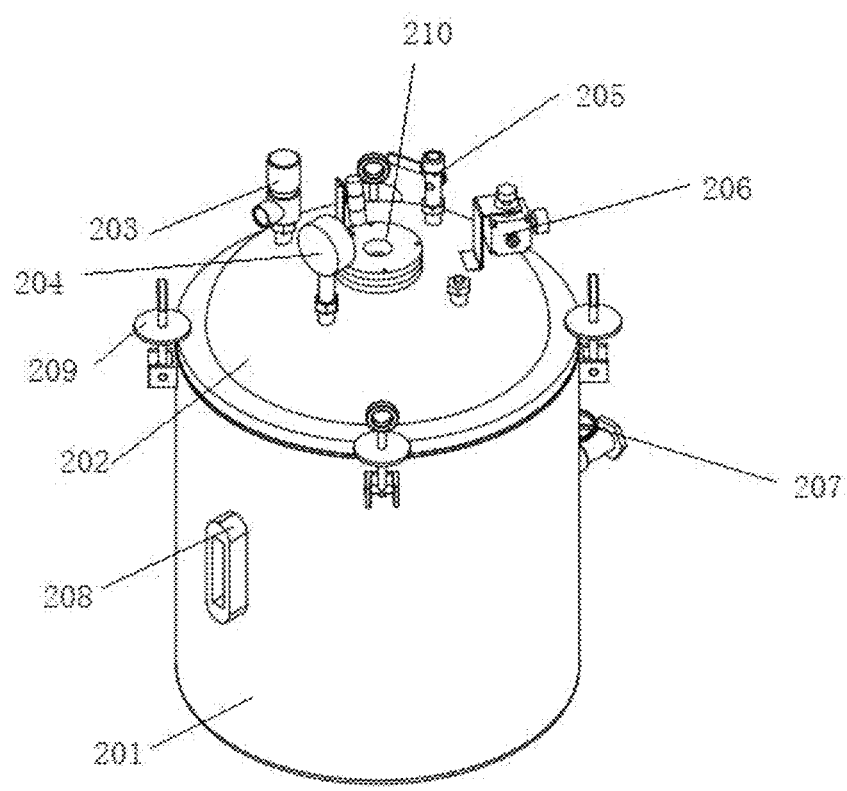
FIG. 5 is a perspective view of a separating device provided by an embodiment of the present invention.
Figure 6:
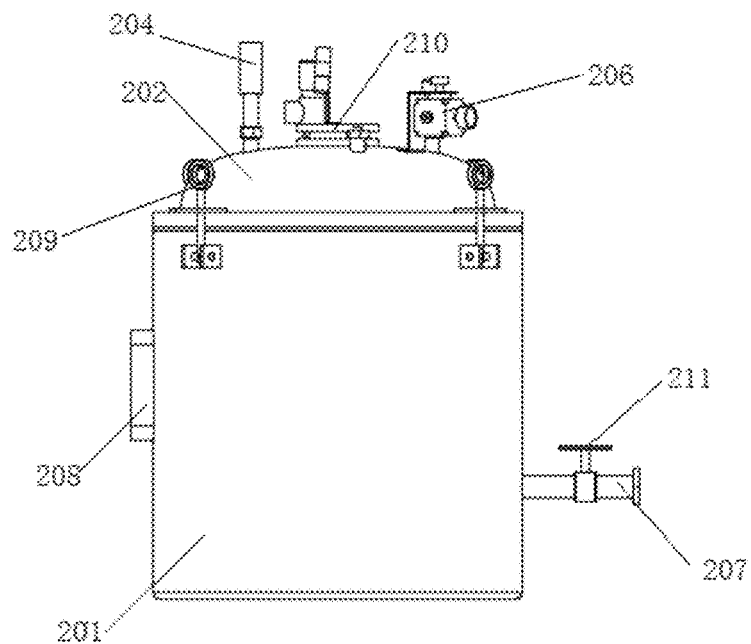
FIG. 6 is a front view of a separating device provided by an embodiment of the present invention.
Figure 7:
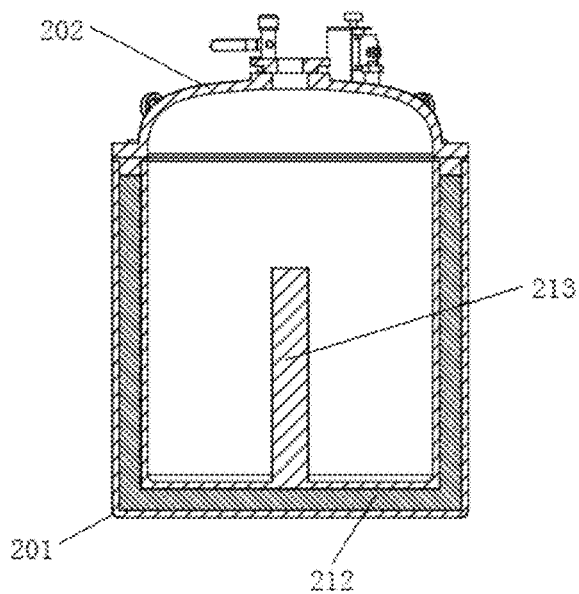
FIG. 7 is a cross-sectional view of a separating device provided by an embodiment of the present invention.
Figure 8:
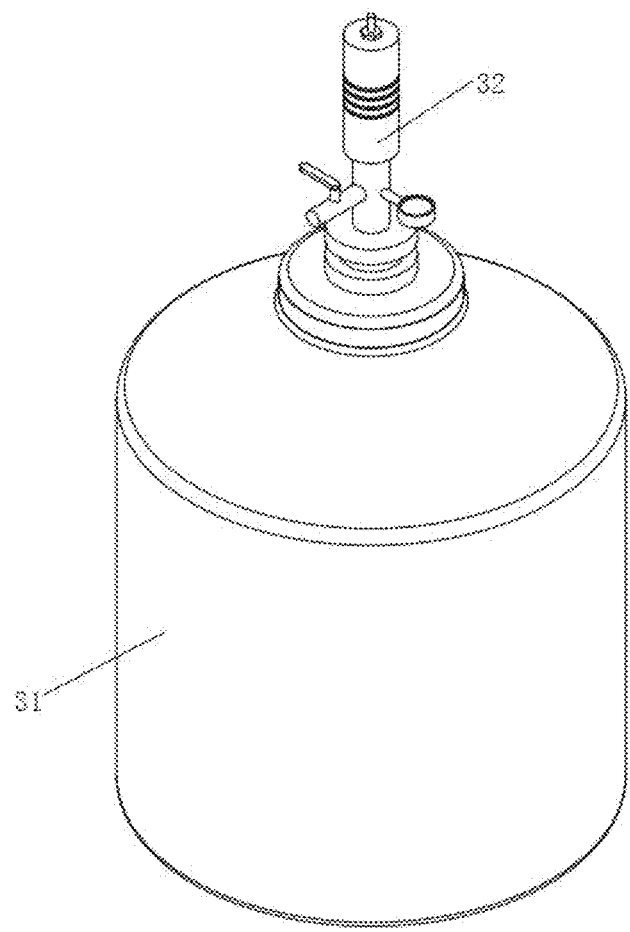
FIG. 8 is a structural schematic view of a liquid nitrogen storage device provided by an embodiment of the present invention.

As shown in FIG. 5, the liquid nitrogen storage device 3 comprises a liquid nitrogen storage tank 31 and a sealing device 32 mounted therein; the sealing device 32 comprises a sealing body 321, an adjusting knob 323 and a sealing ring 322; the adjusting knob 323 and the sealing body 321 are in screwed connection, the sealing body 321 is provided with steps, the sealing ring 322 is mounted between an adjustment device and the step of the sealing body 321. The adjusting knob 323 is rotated to extrude the sealing ring 322 to radially expand, thereby achieving sealing. The sealing body 321 is provided with a gas inlet passage 325 and a liquid outlet passage 326; the gas inlet passage 325 is connected to the pressurizing pump 11 with a stop valve provided therebetween. The liquid outlet passage 326 is connected to the separating device 2 with a liquid valve 327 provided therebetween, and the liquid valve 327 is connected to the liquid inlet valve 211. The liquid outlet passage 326 is provided with a second pressure gauge 324 for detecting a pressure in the liquid nitrogen storage tank.

In the present invention, a film roll bonded into a block is wholly placed into the film receiving chamber where the liquid nitrogen is contained. During the gasification of the liquid nitrogen, due to a difference between expansion coefficients of a base layer and an emulsion layer of a film roll under a low temperature, micro-pores and gaps may be generated in the base layer and the emulsion layer of the bonded film roll. The gases may flow through the gaps between the layers of the bonded film roll; and the film roll is separated after the liquid nitrogen in the airtight device is completely gasified and the temperature therein is raised to the room temperature. The whole process utilizes a natural force of liquid nitrogen gasification to separate the film roll non-destructively, and the treatment time of the liquid nitrogen may be adjusted according to the bonding degree of the film roll.

The present invention solves the current situation of the breakage of the already fragile film caused by the artificial separation, or the falling of the image layer with a reduced bonding force. In addition. The separation time is flexible, and it can be selected appropriately according to the bonding state of the film. More importantly, the pH, dimensional stability, and mechanical properties of the film roll are not damaged during the separation, and the purpose of non-destructive separation can be achieved, while the operation method is simple and the cost is low. Therefore, the present invention has an important application and promotion value.

Based on the present invention, there is provided a separating method for a bonded cine film, comprising:

accommodating a cine film to be separated into a film receiving chamber, and pressurizing a liquid nitrogen storage device 3 by a pressurizing device 1;

injecting liquid nitrogen of the liquid nitrogen storage device 3 into the film receiving chamber, and gasifying the liquid nitrogen at a rate of 2.0 L/h to 3.0 L/h to separate the cine film;

wherein, the liquid nitrogen is gasified at a rate of 2.0 L/h to 3.0 L/h within a gasification time of 0.5 h to 3 h.

For example, the embodiment of the present invention inspects the use effect of a separating device for a bonded cine film and a method therefor provided by the present invention through an experiment of simulation samples.

Since the main cause of the bonding of the cine film is gelatin liquefaction, this experiment systematically studies the process conditions for the liquid nitrogen to separate the bonded film roll by preparing simulation samples. This experiment simulates the film roll bonding by selecting a cellulose acetate film without disease and a photographic gelatin, comprising the following steps:

Firstly, a gelatin solution having a mass fraction of 5% is prepared. Next, the film is cut into a length of 8 cm, and there are totally 60 films; a syringe is used to drop 0.1 ml of the prepared gelatin solution onto one end of an image layer of a film, and the end of the film roll where the gelatin solution is dropped is covered with an end of a base layer of another film such that they are bonded, with a bonded surface width of 1 cm; the bonded films are naturally dried, and arranged into 6 parallel sets each having 10 films.

Process condition screening for the experiment of the separation of the bonded cine films 1. The influence of the separation time: a set of bonded simulation samples are placed into the separating device 2, an appropriate amount of liquid nitrogen is added, a gasification rate of the liquid nitrogen is adjusted to about 2.0 L/h, and the simulation samples are kept static for 30 min, 60 min, 90 min, 120 min, 150 min and 180 min, respectively; when the temperature in the box falls back to the room temperature, the change of the bonding force of the simulation samples is tested using a universal material testing machine.

2. The influence of the gasification rate of the liquid nitrogen: a set of bonded simulation samples are placed into the separating device 2, an appropriate amount of liquid nitrogen is added, the samples are immersed into the liquid nitrogen, and the separation time is fixed as 60 min, so as to adjust the influence of the gasification rate of the liquid nitrogen on the bonding force between the bonded film rolls. Another set of bonded simulation samples are placed into a sample tube, sealed with a sealing film and suspended in a liquid nitrogen tank to investigate the change of the bonding force of the simulation samples under a low temperature without any nitrogen gasification.

3. The influence of the placement location of the film roll: a set of bonded simulation samples are placed on a bottom of the separating device 2, another set of samples are placed at a location about 5 cm away from the bottom, a last set of samples are placed at a location about 10 cm away from the bottom, and those samples are covered and sealed; liquid nitrogen is introduced, such that a level of the liquid nitrogen is 4 cm, the first set of simulation samples are completely immersed in the liquid nitrogen, the bottoms of the second set of simulation samples are 1 cm away from the liquid surface, and the bottoms of the third set of simulation samples are 6 cm away from the liquid surface; the gasification rate of the liquid nitrogen is adjusted to 2.0 L/h, and when the temperature in the box falls back to the room temperature, the change of the bonding force of the simulation samples is tested.

4. The microscopic morphology of the separation of the bonded film: the bonded films are cut into 4 sets of samples with a length of 35 mm, a width of 35 mm and a thickness of about 5 mm; a set of bonded samples are placed on a bottom of the separating device 2, another set of samples are placed at a location about 5 cm away from the bottom, a last set of samples are placed at a location about 10 cm away from the bottom, and those samples are covered and sealed; liquid nitrogen is introduced, such that a level of the liquid nitrogen is 4 cm, and the first set of samples are completely immersed in the liquid nitrogen; the bottoms of the second set of samples are 1 cm away from the liquid surface, and the bottoms of the third set of simulated samples are 6 cm away from the liquid surface; the gasification rate of the liquid nitrogen is adjusted to 2.0 L/h with the gasification time of 1 h, and when the temperature in the box falls back to the room temperature, the change of the bonding degree of the side of the film is observed using an ultra depth-of-field microscope. The fourth set of bonded samples are placed in a sample tube, sealed with a sealing film and suspended in a liquid nitrogen tank, and taken out after 1 hour; when the temperature falls back to the room temperature, the change of the bonding degree of the side of the film is observed using an ultra depth-of-field microscope.

Experiment Results

The influence of the separation time on the bonded film is shown in Table 1:

TABLE 1

Influence of separation time on bonded film

| | T/min | | | | |
|---|---|---|---|---|---|
| | 0 | 30 | 60 | 90 | 120 |
| Bonding force/N | 87.1 | 68.3 | 39.5 | 28.4 | 11.2 |

As can be seen from Table 1, the bonding force of the bonded films gradually decreases with the increase of the treatment time, which indicates that when the gasification rate of the liquid nitrogen is constant, the purpose of complete separation can be achieved by appropriately increasing the time. During the actual separation, the separation time can be adjusted according to the actual bonding situation of the film roll.

The influence of the gasification rate of the liquid nitrogen on the bonding force between the bonded film rolls is shown in Table 2:

TABLE 2

Influence of gasification rate of liquid nitrogen on bonding force between bonded film rolls

| Gasification rate of liquid nitrogen | Untreated | 0 L/h | 1.0 L/h | 1.5 L/h | 2.0 L/h | 2.5 L/h | 3.0 L/h | 3.5 L/h |
|---|---|---|---|---|---|---|---|---|
| Bonding force/N | 87.1 | 55.4 | 72.7 | 69.4 | 39.5 | 23.4 | 40.1 | 65.2 |

As can be seen from Table 2, when the gasification rate of the liquid nitrogen is less than 2.0 L/h, the decreasing amplitude of the bonding force is small, and the separation efficiency is low; when the gasification rate of the liquid nitrogen is greater than 2.0 L/h and less than 3.0 L/h, the decreasing amplitude of the bonding force is large and the separation efficiency is high; when the gasification rate of the liquid nitrogen increases to be greater than 3.0 L/h, the decreasing amplitude of the bonding force also rises, which indicates that the gasification rate of the liquid nitrogen should not be too fast when the bonded film roll is actually separated. The samples placed in the sample tube in the liquid nitrogen tank have a bonding force of 55.4 N, which indicates that at a temperature of −196° C. and when there is no gasification of the liquid nitrogen, the decreasing amplitude of the bonding force is less than that under an optimal separating rate for the gasification rate of 2.0 L/h to 3.0 L/h, and the gasification process of the liquid nitrogen is beneficial to the separation of the film.

The influence of the placement location on the bonding force of the bonded film roll is shown in Table 3:

TABLE 3

Influence of film placement location on bonding force of bonded film roll

| | Untreated | First set | Second set | Third set |
|---|---|---|---|---|
| Bonding force/N | 87.1 | 39.5 | 63.5 | 79.4 |

As can be seen from Table 3, when the gasification rate of the liquid nitrogen is 2.0 L/h, the bonding force of the bonded film rolls varies with the placement location of the film in the separating device 2. The first set of films are completely submerged in the liquid nitrogen by immersion during the separation, the bonding force decreases from 87.1 N to 39.5 N, and the decreasing amplitude is large; the placement locations of the second set of films are about 1 cm away from the liquid surface during the separation, and the bonding force decreases from 87.1 N to 63.5 N; the placement locations of the third set of films are about 6 cm away from the liquid surface during the separation, and the bonding force decreases from 87.1 N to 79.4 N. As can be seen from the above data, during the separation, the decreasing amplitude of the bonding force is the largest when the film roll is submerged in the liquid nitrogen by immersion, while the decreasing amplitude of the bonding force is reduced and the separation effect is degraded as the distance between the placed film roll and the liquid surface increases.

Figure 10E:
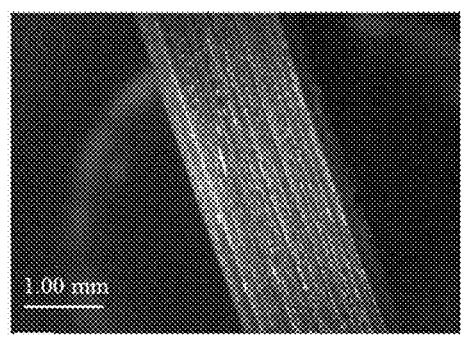
FIG. 10e is a CCD diagram of untreated comparative sets provided by an embodiment of the present invention.
Figure 10E:
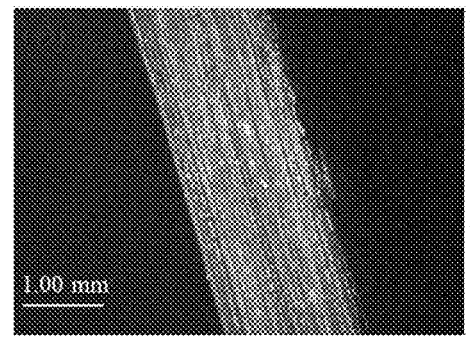
Figure 10E:
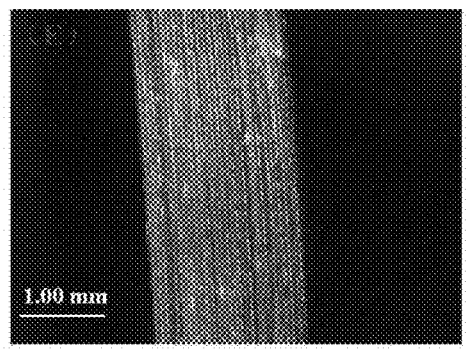

FIG. 10a is a CCD diagram of a bonded film peeling process obtained through a first set of experiments. As shown in FIG. 10a, after the first set of samples completely immersed into the liquid nitrogen are treated, wide gaps are produced between the bonded films. FIGS. 10b and 10c are CCD diagrams of bonded film peeling processes obtained through second and third sets of experiments, respectively. As shown in FIGS. 10b and 10c, as the distance between the placement location and the liquid nitrogen increases, the produced gaps are fewer and narrower, which indicates that under the ultra-low temperature environment of the liquid nitrogen, gaps will occur between the bonded films since the base layer and the image layer of the bonded film have different thermal expansion coefficients. The gaps become wider as the temperature decreases. Thus, the ultra-low temperature environment of the liquid nitrogen is the essential condition for separating the bonded film. As shown in FIG. 10d, although the environment where the fourth set of films are located is still the ultra-low temperature environment of the liquid nitrogen, there is no large gap generated, which indicates that the liquid nitrogen immerges between the layers of the bonded film, and the gasification process is very important for the separation of the bonded film. FIG. 10e illustrates the untreated comparative sets.

A large number of experiments have proved that the best way for the liquid nitrogen to separate the bonded film roll is as follows: the cellulose acetate cine film rolls bonded into blocks are placed in the airtight device horizontally; 3 film rolls can be placed at the same time according to the volume of the device, with an interval of 1 cm; it is set that when the pressure in the airtight device reaches 0.17 MPa, the safety valve 203 is automatically opened to release gas, liquid nitrogen is injected into the bonding film separating device 2 until the uppermost film roll is submerged. The gasification rate of the liquid nitrogen is adjusted to be greater than 2 L/h and less than 3 L/h, and the film rolls are taken out after the liquid nitrogen is completely vaporized and the temperature in the device rises back to the room temperature, thereby finishing the separation of the film rolls. The superiority and effectiveness of the device and method are confirmed by characterizing the physical properties and microstructure of the film roll before and after the separation.

The specific embodiments of the present invention are merely illustrative of the spirit of the present invention, and those skilled in the art can amend the specific embodiments described or make similar method replacement, without departing from the spirit of the present invention.

The invention claimed is:

1. A separating device for a bonded cine film, comprising a pressurizing device (1), a separating device (2) and a liquid nitrogen storage device (3);
the liquid nitrogen storage device (3) comprises a liquid nitrogen storage tank (31) and a sealing device (32); the sealing device (32) is mounted at an outlet of the liquid nitrogen storage tank (31), and the liquid nitrogen storage tank (31) is connected to the separating device (2) through the sealing device (32), for providing liquid nitrogen to the separating device (2);
the pressurizing device (1) is connected to the liquid nitrogen storage tank (31) through the sealing device, for providing a pressure to the liquid nitrogen storage device (3);
the separating device (2) is provided therein with a film receiving chamber for accommodating a film to be separated; the pressurizing device (1) pressurizes the liquid nitrogen storage device (3) to allow the liquid nitrogen to enter the film receiving chamber; the film receiving chamber is a sealed chamber and provided with a gas release valve that can be opened to start a gasification of the liquid nitrogen in the film receiving chamber, so as to separate the bonded cine film.

2. The separating device for the bonded cine film according to claim 1, wherein the separating device (2) comprises a separating box body (201) and a separating box cover (202) which are in sealed connection;
the film receiving chamber is provided in the separating box body (201), a film fixing shaft (213) is provided in the film receiving chamber, and a thermal insulation layer (212) is provided in a sidewall and a bottom of the separating box body (201), respectively; the separating box cover (202) is provided with a first pressure gauge (204) and a safety valve (203); the gas release valve comprises a coarse-adjustment gas release valve (205) and a fine-adjustment gas release valve (206) which are mounted on the separating box cover.

3. The separating device for the bonded cine film according to claim 2, wherein a liquid nitrogen inlet (207) is provided on a sidewall of the separating box body (201), and a liquid inlet valve (211) is provided on the liquid nitrogen inlet (207).

4. The separating device for the bonded cine film according to claim 2, wherein a first observation window (208) is provided on a sidewall of the separating box body (201), and a second observation window (210) is provided on the separating box cover (202).

5. The separating device for the bonded cine film according to claim 2, wherein the sealing box body (201) is provided with a sealing ring (322) at a position contacting the separating cover body, and the separating box body (201) and the separating cover body are connected to each other through a fastener (209).

6. The separating device for the bonded cine film according to claim 1, wherein the sealing device (32) comprises a sealing body (321), an adjusting knob (323) and a sealing ring (322); the adjusting knob (323) and the sealing body (321) are in screwed connection, the sealing ring (322) is mounted between an adjustment device and the sealing body (321), and the adjusting knob (323) can be rotated to extrude the sealing ring (322) to radially expand, thereby achieving sealing.

7. The separating device for the bonded cine film according to claim 6, wherein the sealing body (321) is provided with a gas inlet passage (325) connected to the pressurizing device (1), and a liquid outlet passage (326) connected to the separating device (2), while a liquid valve (327) is provided between the liquid outlet passage (326) and the separating device (2).

8. The separating device for the bonded cine film according to claim 1, wherein the pressurizing device (1) comprises a pressurizing pump (11), a pressurizing pump box (12) and a stop valve (13); the pressurizing pump (11) is mounted in the pressurizing pump box (12), and the stop valve (13) has one end connected to the pressurizing pump (11), and the other end connected to the liquid nitrogen storage device (3).

9. A separating method based on a separating device for a bonded cine film according to any one of claims 1 to 8, wherein the method comprising:
accommodating a cine film to be separated into a film receiving chamber, and pressurizing a liquid nitrogen storage device (3) by a pressurizing device (1); and
injecting liquid nitrogen of the liquid nitrogen storage device (3) into the film receiving chamber, and gasifying the liquid nitrogen at a rate of 2.0 L/h to 3.0 L/h to separate the cine film.

10. The method according to claim 9, wherein the liquid nitrogen is gasified at a rate of 2.0 L/h to 3.0 L/h within a gasification time of 0.5 h to 3 h.

* * * * *